(12) United States Patent
Lei et al.

(10) Patent No.: US 8,501,613 B2
(45) Date of Patent: Aug. 6, 2013

(54) UBM ETCHING METHODS FOR ELIMINATING UNDERCUT

(75) Inventors: Yi-Yang Lei, Wuqi Township (TW); Hung-Jui Kuo, Hsin-Chu (TW); Chung-Shi Liu, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/178,276

(22) Filed: Jul. 7, 2011

(65) Prior Publication Data

US 2013/0012014 A1 Jan. 10, 2013

(51) Int. Cl.
*H01L 21/44* (2006.01)
(52) U.S. Cl.
USPC .... 438/612; 438/613; 438/614; 257/E21.477; 257/E21.508
(58) Field of Classification Search
USPC .................. 438/612, 613, 614; 257/E21.477, 257/E21.508
See application file for complete search history.

(56) References Cited

U.S. PATENT DOCUMENTS

| | | | | |
|---|---|---|---|---|
| 4,490,211 A * | 12/1984 | Chen et al. | | 216/62 |
| 4,684,437 A * | 8/1987 | Donelon et al. | | 216/66 |
| 5,376,584 A * | 12/1994 | Agarwala | | 438/614 |
| 5,693,565 A * | 12/1997 | Camilletti et al. | | 438/17 |
| 5,838,067 A * | 11/1998 | Baek | | 257/737 |
| 6,784,089 B2 * | 8/2004 | Lei et al. | | 438/613 |
| 7,541,275 B2 * | 6/2009 | Mercer et al. | | 438/614 |
| 7,994,045 B1 * | 8/2011 | Huemoeller et al. | | 438/612 |
| 2010/0244241 A1 * | 9/2010 | Marimuthu et al. | | 257/737 |
| 2011/0026232 A1 * | 2/2011 | Lin et al. | | 361/760 |

* cited by examiner

*Primary Examiner* — Charles Garber
*Assistant Examiner* — Ron Pompey
(74) *Attorney, Agent, or Firm* — Slater & Matsil, L.L.P.

(57) ABSTRACT

A method includes forming an under-bump metallurgy (UBM) layer overlying a substrate, and forming a mask overlying the UBM layer. The mask covers a first portion of the UBM layer, and a second portion of the UBM layer is exposed through an opening in the mask. A metal bump is formed in the opening and on the second portion of the UBM layer. The mask is then removed. A laser removal is performed to remove a part of the first portion of the UBM layer and to form an UBM.

12 Claims, 5 Drawing Sheets

UBM ETCHING METHODS FOR ELIMINATING UNDERCUT

BACKGROUND

In the formation of a semiconductor wafer, integrated circuit devices such as transistors are first formed at the surface of a semiconductor substrate. Interconnect structures are then formed over the integrated circuit devices. Metal bumps are formed on the surface of the semiconductor chip, so that the integrated circuit devices can be accessed.

In a typical metal-bump formation process, an under-bump metallurgy (UBM) layer is first formed to electrically couple to a metal pad. The UBM layer may include a titanium layer, and a copper seed layer over the titanium layer. Metal bumps are then formed on the UBM layer, for example, by plating. The formation process includes forming a mask to cover first portions of the UBM layer, and leave second portions of the UBM layer un-covered. The metal bumps are formed on the second portions of the UBM layer. After the formation of the metal bumps, the mask is removed, and the first portions of UBM layer are removed by wet etching. It was observed that the wet etching caused undercuts to be formed under the metal bumps due to the lateral etching of the titanium layer. As a result, metal bumps may delaminate from the respective chip or wafer, resulting in a low yield in the metal bump formation process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming metal bumps with no undercuts in the underlying under-bump metallurgies (UBMs) is provided in accordance with various embodiments. The intermediate stages of manufacturing the metal bumps and the UBMs in accordance with the embodiments are illustrated. The variations of the embodiments are discussed. Throughout the various views and illustrative embodiments, like reference numbers are used to designate like elements.

Figure 1:
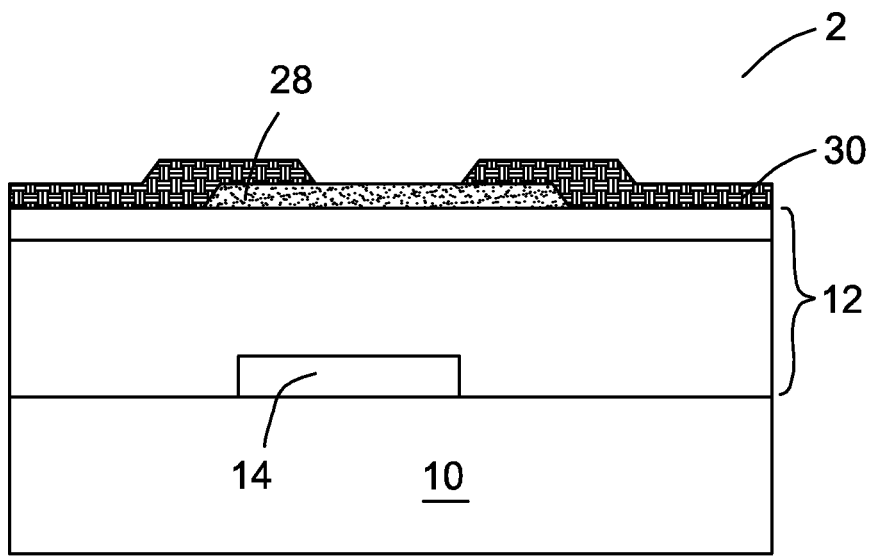
FIGS. 1 through 5 are cross-sectional views of intermediate stages in the manufacturing of a metal bump in accordance with an embodiment.

Referring to FIG. 1, wafer 2, which includes substrate 10, is provided. In an embodiment, substrate 10 is a semiconductor substrate such as a silicon substrate, although it may be formed of other semiconductor materials, such as silicon germanium, silicon carbon, gallium arsenide, or the like. Semiconductor devices 14, which may include transistors, diodes, resistors, or the like, may be formed at the surface of substrate 10. Interconnect structure 12, which includes metal lines and vias (not shown) formed therein and electrically coupled to semiconductor devices 14, is formed over substrate 10. The metal lines and vias may be formed of copper or copper alloys, and may be formed using damascene processes. Interconnect structure 12 may include an inter-layer dielectric (ILD) and inter-metal dielectrics (IMDs). In alternative embodiments, wafer 2 is an interposer wafer or a wafer of package substrates, and is substantially free from active devices including transistors and passive devices such as resistors, capacitors, inductors, and/or the like. In these embodiments, substrate 10 may be formed of a semiconductor material or a dielectric material such as silicon oxide.

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnect structure 12. Passivation layer 30 may be formed to cover edge portions of metal pad 28. In an exemplary embodiment, passivation layer 30 is formed of polyimide or other dielectric materials such as silicon oxide, silicon nitride, and multi-layers thereof.

Figure 2:
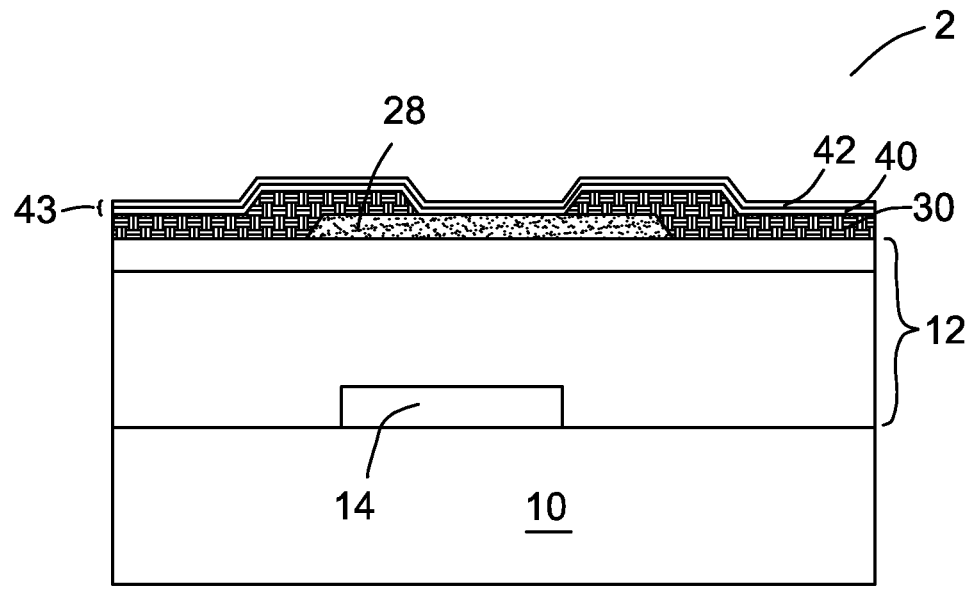

Referring to FIG. 2, under-bump metallurgy (UBM) layer 43 is formed. In an embodiment, UBM layer 43 includes barrier layer 40 and seed layer 42 over barrier layer 40. Barrier layer 40 extends into the opening in passivation layer 30 and is electrically coupled to, and may be in physical contact with, metal pad 28. Barrier layer 40 may be a titanium layer, a titanium nitride layer, a tantalum layer, or a tantalum nitride layer, or layers formed of a titanium alloy or a tantalum alloy. The materials of seed layer 42 may include copper or copper alloys, and hence seed layer 42 is alternatively referred to as a copper seed layer hereinafter. However, other metals such as silver, gold, aluminum, palladium, nickel, nickel alloys, tungsten alloys, chromium, chromium alloys, and combinations thereof may also be included. In an embodiment, barrier layer 40 and seed layer 42 are formed using physical vapor deposition (PVD) or other applicable methods. Barrier layer 40 may have a thickness between about 500 Å and about 2,000 Å. Seed layer 42 may have a thickness between about 1,000 Å and about 10,000 Å, although different thicknesses may be used.

Figure 3:
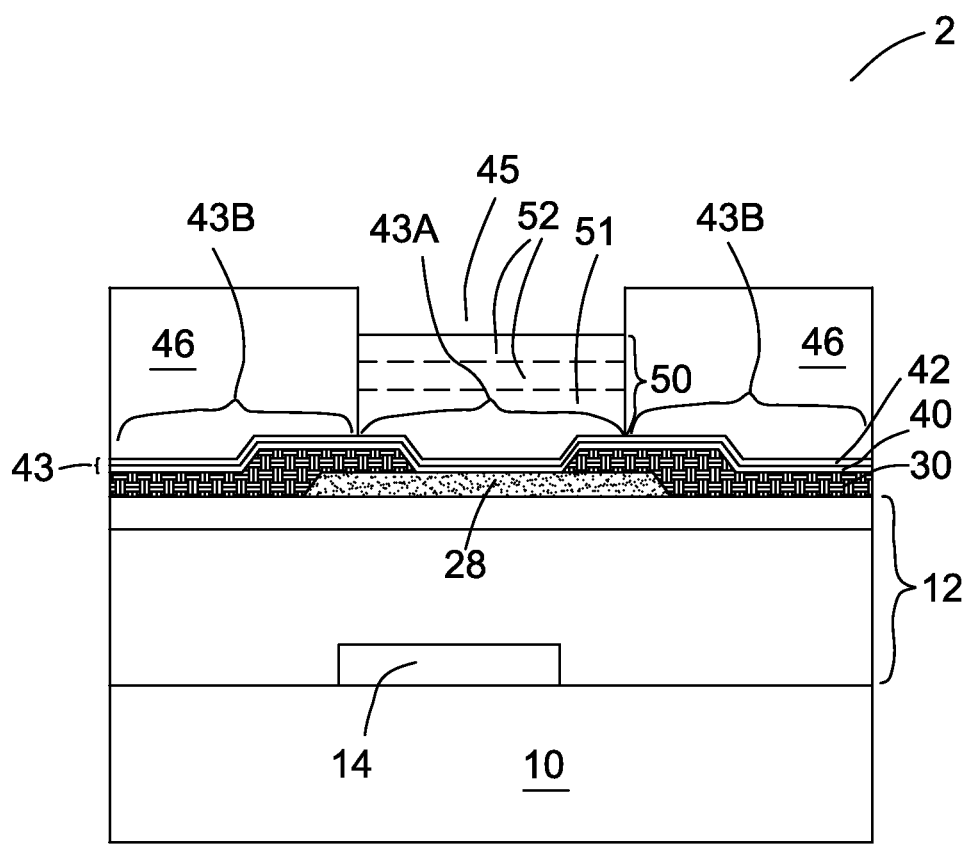

FIG. 3 illustrates the formation of mask 46, which may be formed of a photo resist or a dry film, for example. Mask 46 is patterned, and a first portion 43A of UBM layer 43 is exposed through opening 45 in mask 46, while second portion(s) 43B of UBM layer 43 are covered by mask 46. Next, as also shown in FIG. 3, metal bump 50 is formed. In an embodiment, wafer 2 is placed into a plating solution (not shown), and a plating step is performed to form metal bump 50 on UBM layer 43 and in opening 45. The plating may be an electro-plating, an electroless-plating, an immersion plating, or the like. In an exemplary embodiment, metal bump 50 is a copper bump, or may include a copper bump with a cap layer(s) selected from the group consisting of a nickel layer, a nickel alloy, a Sn—Ag alloy layer, a Sn—Cu alloy layer, a Sn—Ag—Cu alloy layer, a palladium layer, a gold layer, a silver layer, and combinations thereof. In alternative embodiments, metal bump 50 is a solder bump, which may be formed of a Sn—Ag alloy, a Sn—Cu alloy, a Sn—Ag—Cu alloy, or the like, and may be lead-free or lead-containing.

Figure 4:
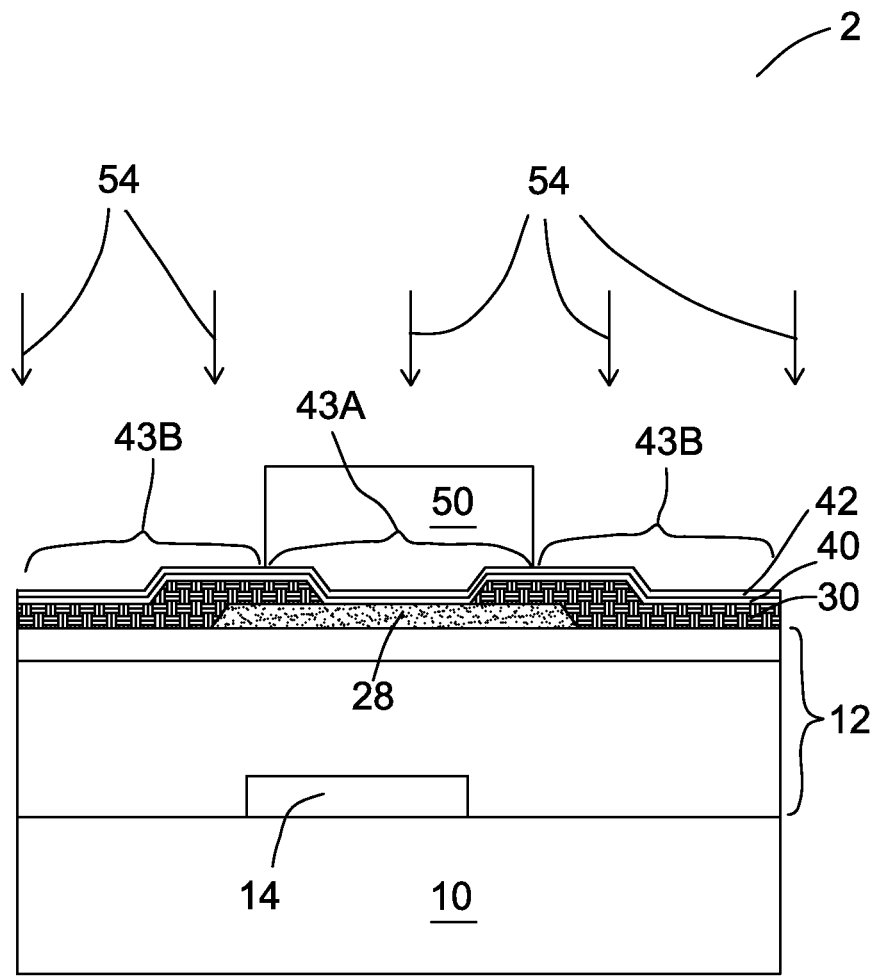

In the embodiments wherein metal bump 50 comprises copper bump 51. additional layers 52 such as solder cap, a nickel layer, a tin layer, a palladium layer, a gold layer, alloys thereof, and/or multi-layers thereof, may be formed as a portion of metal bump 50, wherein layers 52 may be over copper bump 51. Furthermore, additional layers 52 may be formed before or after the subsequent removal of mask 46, which removal step is shown in FIG. 4. Referring to FIG. 4, after the formation of metal bump 50, mask 46 is removed, and portions 43B of UBM layer 43 that are previously covered by mask 46 are exposed.

Figure 5:
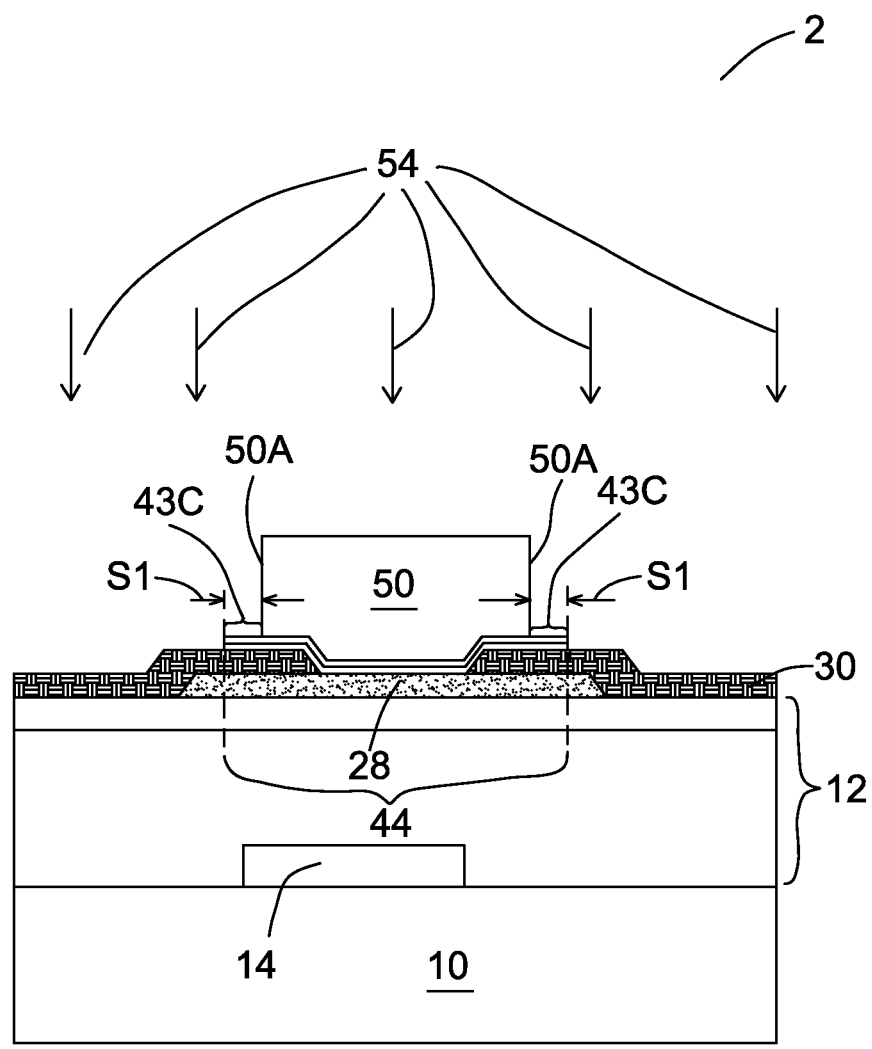
Figure 6:
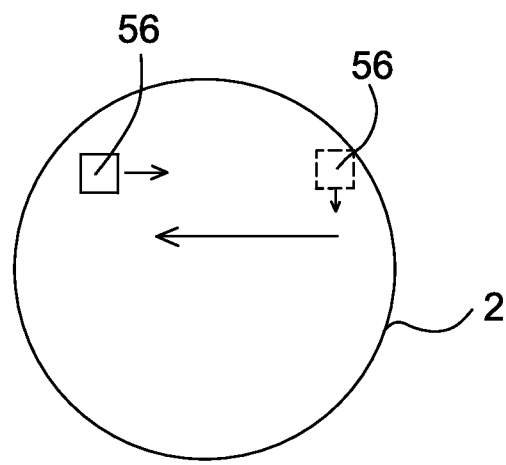
FIG. 6 illustrates a top view of a wafer, on which a laser removal is performed to remove portions of a under-bump-metallurgy (UBM) layer.
Figure 7:
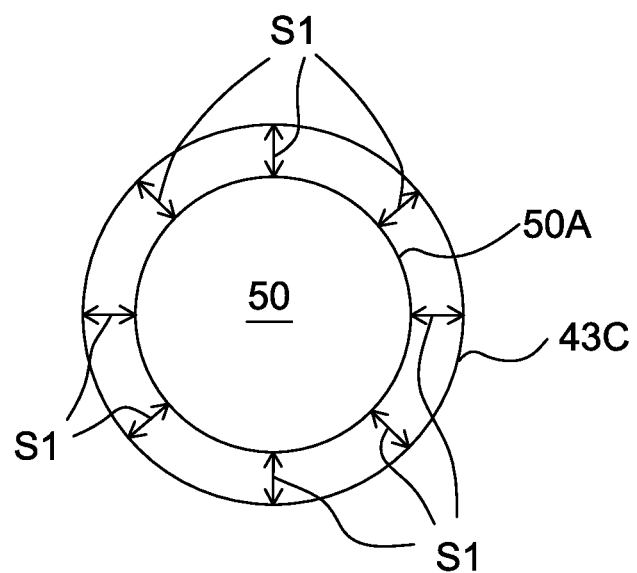
FIG. 7 illustrates a top view of a metal bump and an underlying UBM.

FIG. 5 illustrates the removal of exposed portions 43B (FIG. 4) of UBM layer 43. The removal step is performed using laser beam 54, which is projected on metal bump 50 and UBM portions 43B. FIG. 7 schematically illustrates spot 56 of laser beam 54 on wafer 2, wherein spot 56 is where wafer 2 receives laser beam 54. Spot 56 may have a rectangular shape, a circular shape, or the like. Spot 56 may have a spot size between about 1 mm×1 mm and about 50 mm×50 mm, for example. It is realized, however, that the dimensions recited throughout the description are merely examples, and may be changed to other suitable values. Laser beam 54 may be projected at one spot 56 each time, and then step forward (as illustrated by arrows in FIG. 6) to neighboring spots, until the entire wafer 2 is projected with laser beam 54. In an embodiment, laser beam 54 may be projected to each spot 56 for a duration between about 10 milliseconds and about one second. Laser beam 54 may finish scanning a 12-inch wafer (wafer 2) in one or two minutes.

In an exemplary embodiment, laser beam 54 is a beam of ultra-violet laser, which may have a wavelength between about 100 nm and about 400 nm. The energy level provided by laser beam 54 may be between about 300 milli-Joules/cm$^2$ (mJ/cm$^2$) and about 1,500 mJ/cm$^2$, or between about 400 mJ/cm$^2$ and about 1,400 mJ/cm$^2$. It is noted that the desirable energy level may be related to the structure of wafer 2, including the thickness of UBM layer 43, and the optimum energy level may be determined through experiments. A low energy level will not be able to cause UBM portion 43B to be removed, while a high energy level may cause damage to wafer 2. The optimum energy level may be selected to remove UBM layer 43 efficiently without causing damage to wafer 2.

The high energy provided by laser beam 54 (FIG. 5), when received by outer parts of portions 43B (FIG. 4), which outer parts are away from metal bump 50, causes the bonding between the atoms in UBM layer 43 to break. As a result, the outer parts of UBM portions 43B become powder under the impact of laser beam 54, and the powder is removed. The remaining parts of UBM layer 43 form UBM 44. Metal bump 50, on the other hand, has a thickness much greater than the thickness of UBM 44, and the energy from laser beam 54 may be distributed and absorbed by metal bump 50, and hence laser beam 54 does not cause the removal or the thinning of metal bump 50.

As shown in FIG. 5, UBM 44 includes a portion covered by metal bump 50, and portion (s) 43C that are not removed by laser beam 54, wherein portions 43C are not covered by metal bump 50. The reason that portions 43C are not removed is because portions 43C are close to the bulk metal bump 50, and hence the energy received by portions 43C is absorbed by adjacent metal bump 50, and portions 43C are protected from the laser removal.

FIG. 7 illustrates a top view of the structure shown in FIG. 5, portions 43C extend beyond the outer edges 50A of metal bump 50 in all directions, and by a substantially uniform width S1, which may be between about 1 μm and about 10 μm. Alternatively stating, portions 43C may form a ring encircling metal bump 50, wherein all portions of the ring may have a substantially uniform width S1.

By using the embodiments, no wet etch is performed to remove the exposed barrier layer and seed layer, the undercuts to the barrier layer is completely eliminated. Furthermore, the copper loss of the metal bump occurred during conventional wet etch steps of the copper seed layer is also eliminated. The resulting UBM in the final structure extends beyond edges of metal bump 50. Accordingly, the reliability of the metal bump formation process is significantly improved due to the reduced delamination caused by the undercuts.

In accordance with embodiments, a method includes forming a UBM layer overlying a substrate, and forming a mask overlying the UBM layer. The mask covers a first portion of the UBM layer, and a second portion of the UBM layer is exposed through an opening in the mask. A metal bump is formed in the opening and on the second portion of the UBM layer. The mask is then removed. A laser removal is performed to remove a part of the first portion of the UBM layer and to form an UBM.

In accordance with other embodiments, a method includes forming a metal pad over a substrate, forming a passivation layer over the metal pad, and forming a titanium barrier layer over the passivation layer and extending into an opening in the passivation layer to electrically couple to the metal pad. A copper seed layer is formed over the titanium barrier layer. A mask is formed over the copper seed layer, wherein the mask covers a first portion of the copper seed layer, and wherein a second portion of the copper seed layer is not covered by the mask. A metal bump is formed on the second portion of the copper seed layer. The mask is removed to expose the first portion of the copper seed layer. A laser beam is projected on the metal bump and the copper seed layer.

In accordance with yet other embodiments, an integrated circuit structure includes a metal pad over a substrate, a passivation layer over the metal pad, and a UBM over the passivation layer and extending into an opening in the passivation layer to electrically couple to the metal pad. The UBM includes a titanium barrier layer and a copper seed layer over the titanium barrier layer. A metal bump is formed over and vertically overlapping a first portion of the UBM, wherein the UBM further comprises a second portion not vertically overlapped by the metal bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming an under-bump metallurgy (UBM) layer overlying a substrate;

forming a mask overlying the UBM layer, wherein the mask covers a first portion of the UBM layer, with a second portion of the UBM layer exposed through an opening in the mask;

forming a metal bump in the opening and on the second portion of the UBM layer;

removing the mask; and performing a laser removal to remove a part of the first portion of the UBM layer to form an UBM, wherein after the step of the laser removal, a part of the first portion of the UBM is not removed, and wherein the UBM comprises the second portion of the UBM layer and a remaining part of the first portion of the UBM layer, with the remaining part of the first portion of the UBM layer exposed to a laser beam during the laser removal.

2. The method of claim 1, wherein the UBM comprises a titanium layer, and a copper seed layer over the titanium, and the part of the first portion of the UBM layer removed during the step of the laser removal includes a portion of the titanium layer and a portion of the copper seed layer.

3. The method of claim 1, wherein the remaining part of the first portion of the UBM forms a ring having a substantially uniform width.

4. The method of claim 1, wherein the laser removal is performed for a duration between about 10 milliseconds and about one second.

5. The method of claim 1, wherein the laser removal is performed using a laser beam having a wavelength between about 100 nm and about 400 nm.

6. The method of claim 1, wherein the laser removal is performed using a laser beam having an energy level between about 300 milli-Joules/cm$^2$ and about 1,500 milli-Joules/cm$^2$.

7. A method comprising:
   forming a metal pad over a substrate;
   forming a passivation layer over the metal pad;
   forming a titanium barrier layer over the passivation layer and extending into an opening in the passivation layer to electrically couple to the metal pad;
   forming a copper seed layer over the titanium barrier layer;
   forming a mask over the copper seed layer, wherein the mask covers a first portion of the copper seed layer, and wherein a second portion of the copper seed layer is not covered by the mask;
   forming a metal bump on the second portion of the copper seed layer;
   removing the mask to expose the first portion of the copper seed layer; and
   projecting a laser beam on the metal bump and the copper seed layer, wherein after the step of projecting the laser beam, a first part of the copper seed layer exposed to the laser beam is removed, and a second part of the copper seed layer that is exposed to the laser beam remains.

8. The method of claim 7, wherein after the step of projecting the laser beam, a portion of the titanium barrier layer directly under the first part of the copper seed layer is removed.

9. The method of claim 7, wherein the second part of the copper seed layer forms a ring encircling the metal bump, and all portions of an entirety of the ring have a substantially uniform width.

10. The method of claim 7, wherein the laser beam is projected for a duration between about 10 milliseconds and about one second.

11. The method of claim 7, wherein the laser beam has a wavelength between about 100 nm and about 400 nm.

12. The method of claim 7, wherein the laser beam has an energy level between about 300 milli-Joules/cm$^2$ and about 1,500 milli-Joules/cm$^2$.

* * * * *